United States Patent
Sato et al.

(10) Patent No.: US 6,376,340 B1
(45) Date of Patent: Apr. 23, 2002

(54) METHODS FOR FORMING POLYCRYSTALLINE SILICON FILM

(75) Inventors: Yuuichi Sato; Hisayoshi Yamoto; Hideo Yamanaka, all of Kanagawa; Hajime Yagi, Tokyo, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/524,913

(22) Filed: Mar. 14, 2000

(30) Foreign Application Priority Data

Mar. 16, 1999 (JP) .......................................... 11-069641

(51) Int. Cl.⁷ ........................ H01L 21/20; H01L 21/36; H01L 21/469
(52) U.S. Cl. ...................................... 438/488; 438/788
(58) Field of Search ................................ 438/488, 491, 438/492, 495, 505, 506, 788; 427/564

(56) References Cited

U.S. PATENT DOCUMENTS

| | | | |
|---|---|---|---|
| 4,871,581 A | 10/1989 | Yamazaki | ..................... 427/39 |
| 4,931,897 A | 6/1990 | Tsukamoto et al. | ......... 361/313 |
| 5,985,703 A | 11/1999 | Banerjee | ..................... 438/162 |
| 6,069,094 A | 5/2000 | Matsumura et al. | ......... 438/788 |
| 6,132,514 A | 10/2000 | Srinivasan et al. | ......... 118/715 |

FOREIGN PATENT DOCUMENTS

JP  62256715 A  11/1987  ......... C01B/33/107

Primary Examiner—Charles Bowers
Assistant Examiner—Brook Kebede
(74) Attorney, Agent, or Firm—Rader, Fishman & Grauer

(57) ABSTRACT

Polycrystalline silicon film forming methods to improve movement of electrons and holes and thus allow the fabrication of high performance semiconductor elements is needed. In a method of the present invention, polycrystalline is formed utilizing as a material, a chemical compound comprising at least one type of impurity from among tin (Sn), germanium (Ge) and lead (Pb) and a polycrystalline silicon film doped with impurities from at least one type from among tin (Sn), germanium (Ge) and lead (Pb) thus formed. In another method, polycrystalline silicon is formed, and the polycrystalline silicon film thus obtained is afterwards then doped with an impurity consisting of at least one type from among tin (Sn), germanium (Ge) and lead (Pb).

11 Claims, 4 Drawing Sheets

METHODS FOR FORMING POLYCRYSTALLINE SILICON FILM

BACKGROUND OF THE INVENTION

1. Field of the Invention

The present invention relates to methods for forming a polycrystalline silicon film to improve electron and hole movement by doping with impurities.

2. Description of Related Art

Polycrystalline silicon is widely used as a material such as for thin film transistors (TFT) in semiconductor devices. Decompression chemical vapor deposition (CVD) utilizing monosilane ($SiH_4$) as the gas is the generally used method for forming a film of polycrystalline silicon.

However, in the polycrystalline silicon film formed by methods such as decompression chemical vapor deposition (CVD), the level of movement of electrons and holes within the film is low so that their use as is, such as for channels is difficult. Therefore, processes such as laser annealing (ELA) or heat treating of the film after forming, are performed to improve the extent of hole and electron movement within the film.

However, even if these heat treating or laser annealing processes are performed on a polycrystalline silicon of the conventional art, the extent of movement is limited to about 80 to 120 $cm^2/V\cdot sec$. The fabrication of further high performance semiconductor devices is therefore difficult to achieve.

Further, if a catalyst CVD method is utilized instead of the decompression CVD method, a polycrystalline silicon film with a movement level up to 50 $cm^2/V\cdot sec$ can be obtained without annealing. However, even if annealing is performed on the this polycrystalline silicon film, the extent of movement obtained will be drastically low compared with electron movement of approximately 540 $cm^2/V\cdot sec$ in a single crystalline film so that the movement level is still to low for fabricating a high performance semiconductor device.

SUMMARY OF THE INVENTION

In view of the above described problems with the conventional art, it is therefore an object of the present invention to provide a method for forming a polycrystalline silicon film to improve electron and hole movement and thus allow the fabrication of high performance semiconductor devices.

In order to achieve the above objects of the invention and solve the above problems of the related art, according to one aspect of the present invention, there is provided a polycrystalline silicon film forming method utilizing as a basic material, a chemical compound comprising at least one type of impurity from among tin (Sn), germanium (Ge) and lead (Pb); and forming a polycrystalline silicon film doped with impurities from at least one type from among tin (Sn), germanium (Ge) and lead (Pb).

To also achieve the objects and solve the problems of the related art, according to another aspect of the present invention, after forming of the polycrystalline silicon film, a polysilicon film doped with impurities comprising at least one type from among tin (Sn) germanium (Ge) or lead (Pb) is formed.

In these forming methods, a polysilicon crystalline film is formed by doping with impurities of at least one type from among tin (Sn), germanium (Ge) and lead (Pb) in group N of the periodic table of the elements so that the polysilicon crystalline film obtained by adding these tin (Sn), germanium (Ge) and lead (Pb) is electrically inert from flaws in those crystals and also, the level of electron and hole movement is increased due to the crystalline disarray and to internal stress.

DETAILED DESCRIPTION OF THE PREFERRED EMBODIMENTS

Figure 1A:
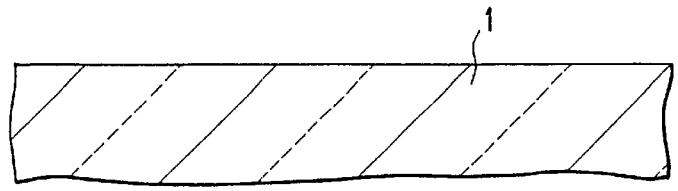
FIGS. 1A and 1B are cross sectional views of essential portions describing the process sequence of the method for forming the polysilicon crystalline film of the present invention.

Hereafter, the embodiments of the present invention are described while referring to the drawings.

Figure 1B:
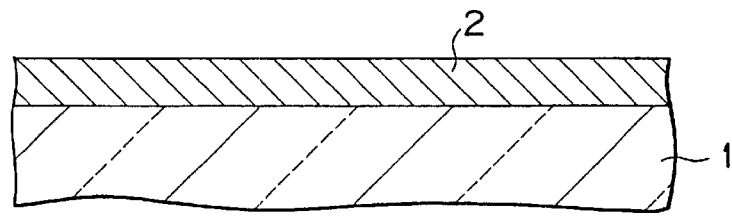

FIGS. 1A and 1B are drawings of one embodiment of the polysilicon crystalline film forming method of claim 1 of the present invention.

Figure 2:
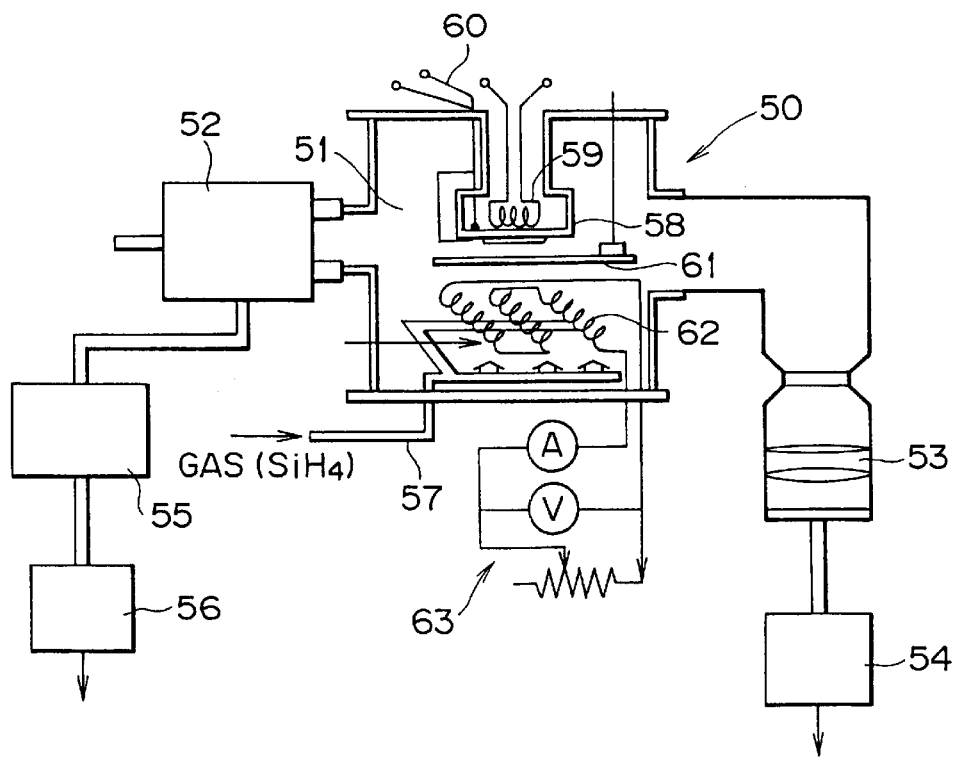
FIG. 2 is a cross sectional concept view of the catalytic chemical vapor deposition device utilized in the present invention.

In this example, a glass substrate as shown in FIG. 1A is provided and a polysilicon crystalline film is formed on the surface of this glass substrate as shown in FIG. 1B by means of the processing in the catalytic chemical vapor deposition (CVD) device shown in FIG. 2.

A catalytic CVD device 50 shown in the concept view of FIG. 2 is next described. The catalytic CVD device 50 comprises a reaction chamber 51 for processing the workpiece and a prechamber 52 connecting to the reaction chamber 51. A turbo molecular pump 53 and a rotary pump 54 are connected in sequence to the reaction chamber 51. A turbo molecular pump 55 and a rotary pump 56 are connected in sequence in the same way to the prechamber 52.

In the reaction chamber 51, a gas pipe 57 is connected to a gas supply source (not shown in drawing) by way of a reactive gas supply system (not shown in drawing), and gas is supplied to the reaction chamber 51 from this gas pipe 57. Also, the upper part of the reaction chamber 51 has a substrate holder (susceptor) 58 for setting a glass substrate 1 utilized as the workpiece. A heater 59 and a thermocouple 60 are installed in this substrate holder 58.

In a substrate holder 58 having this kind of structure, the sample material can be heated by the heater 59 by way of the substrate holder 58. The thermocouple 60 detects the temperature in the substrate holder 58 and controls the extent of the heating by means of the heater 59. An aluminum susceptor can for instance be utilized as the substrate holder 58.

A shutter 61 is installed beneath this substrate holder 58, and a catalyst piece 62 is installed beneath the shutter 61. The catalyst piece 62 may be made from filament wound in a coil shape with for example fine tungsten wire connected to a power supply 63 outside the reaction chamber 51. Heating up to approximately 1600° C. to 1800° C. can be maintained by supplying electrical power from the power supply 63. The catalytic piece 62 is installed at the upper part of the gas supply inlet (not shown in drawing) inside the reaction chamber 51 of the gas pipe 58 and the gas supplied from the gas pipe 58 is broken down and activated.

In the reaction gas supply system connecting to the gas pipe 57, respective gas supply sources of $SiH_4$, $SnH_4$, and $H_2$ are respectively connected to the reaction chamber 51 and an exhaust pump (not shown in drawing). Here, the $SnH_4$, is the Sn material used as the impurity, or in other words the impurity supply source.

A mass flow controller (MFC) (not shown in drawing) and a regulator valve (not shown in drawing) are installed in the pipe for each reaction gas. The MFC and the regulator valve control the supply and stoppage of gas to the reaction chamber 51 as well as the flow rate of gas.

The forming of a polycrystalline silicon film 2 on the surface of the glass substrate 1 by means of the catalytic CVD device 50 as configured above is next described. First of all, the glass substrate 1 shown in FIG. 1A is set on the substrate holder 58 by way of the prechamber 52 of the catalytic CVD device 50.

Next, the turbo molecular pump 55 and the rotary pump 56 are operated and the interior or the reaction chamber 51 decompressed to approximately 1 to $210^{-6}$ PA, and this state maintained for five minutes in particular to remove any moisture or oxygen brought into the reaction chamber 51.

The glass substrate 1 heated and maintained at a temperature of 200° C. by way of the substrate holder 58 and the heater 59. Hydrogen is supplied from the reaction gas control system inside the reaction chamber 51 and the flow rate as well as the pressure inside the reaction chamber 51 regulated to specific values. Here, the flow rate of the hydrogen is set to 150 sccm/min, the pressure in the reaction chamber 51 is set to approximately 1 to 15 Pa and in this example is set to 10 Pa.

Next, the power supply 63 is turned on to supply power to the catalyst piece 62, the temperature raised to 1600° C. to 1800° C. In this example the temperature is set to 1700° C.

The reaction gases $SiH_4$ and $SnH_4$, are also fed into the reaction chamber 51. In this example, the hydrogen flow rate is set at 150 sccm/minute, the $SiH_4$ flow rate is set to 15 sccm/minute (100% silane) and the $SnH_4$ flowrate is set to 15 sccm/minute (0.01% stannane) as the gas supply to the reaction chamber 51, a film is formed for two minutes at a forming speed of 50 nm/minute, and a polycrystalline silicon film 2 formed in a thickness of approximately 80 nm.

When the material gas is supplied in this way into the reaction chamber 51, energy is supplied to the catalytic piece 62 to induce a chemical reaction. This chemical reaction respectively breaks down the $SiH_4$ and $SnH_4$, and generates Si (silicon) and Sn (tin), and along with depositing a polycrystalline silicon film on the surface of the glass substrate 1, at the same time adds Sn (tin) as an impurity to the polycrystalline silicon. The polycrystalline silicon film 2 that was formed then becomes an impurity-doped polycrystalline silicon film. The concentration of the Sn impurity is adjusted by means of the gas flow ratio, to approximately $10^{18}$ atoms/cm$^3$ to $10^{20}$ atoms/cm$^3$.

After the polycrystalline silicon film 2 is formed in this way, the respective flow rates of $SiH_4$ and $SnH_4$ gas are set to zero and only the flow of hydrogen gas is continued. This state is then continued for five minutes, the flow of electrical power to the catalyst piece 62 is stopped and the temperature lowered. Next, the flow rate of hydrogen gas is set to zero, and the pressure inside the reaction chamber 51 further decreased approximately to 1 to $2 \times 10 \times 10^{-6}$, and this state maintained for five minutes to evacuate any $SiH_4$ and $SnH_4$ gas that was fed into the chamber.

Afterwards, the glass substrate 1 is extracted by way of the prechamber 52 to the outside air.

The impurity-doped polycrystalline silicon film obtained in the forming method for this polycrystalline silicon film 2, the crystal faults of the polycrystalline silicon film 2 are made electrically inert by the adding of tin (Sn) which is an element in group N of the periodic table of the elements. The crystal irregularities and the internal strain can thus be reduced and the electron and the hole movement speed can be increased to approximately 200 to 400 cm$^2$/V·sec without an annealing process.

Also, in this method for forming the polycrystalline silicon film 2, in particular, by forming a mask from silicon oxide compounds and silicon nitride compounds, and from silicon oxide compounds, the polycrystalline silicon can be selectively formed just on exposed spots on the surface of the glass substrate 1, without forming deposits of polycrystalline silicon on the mask.

This selective forming is possible because the hydrogen atoms or hydrogen molecule clusters having high energy and broken down by heat and activated by the catalytic piece 62 possess a selective etching effect. By utilizing this selective etching effect polycrystalline silicon can be accumulated only on the surface of the glass substrate 1 without accumulating the polycrystalline silicon on the mask 3.

In the previous example, $SnH_4$ was used however $SnCl_4$ may be used instead, and by bubbling with $H_2$ gas as a carrier gas, then supplied as the material gas.

Also, tin (Sn) was utilized as the impurity to be added, however geranium (Ge) or lead (Pb) may also be utilized instead or a plurality of the three elements may be utilized as the additive.

Also fluorine compounds, hydrogen compounds or organic compounds such as tin (Sn), geranium (Ge) or lead (Pb) may be utilized instead of $SnH_4$ or $SnCl_4$ as the material forming the impurity.

In the example for forming of the polycrystalline silicon using as a material, a chemical compound as the source of impurities, the polycrystalline silicon described previously was added (doped) with at least one type from among tin (Sn), geranium (Ge) or lead (Pb) to form the impurity-doped polycrystalline silicon film. The present invention however is not limited to this method and may for instance, form a film of polycrystalline silicon by a method such as catalytic chemical vapor deposition (CVD), and afterwards, form the impurity-doped polycrystalline silicon film by adding at least one type from among tin (Sn), geranium (Ge) or lead (Pb) to the polycrystalline silicon film. In such a case, ion implantation, ion doping or diffusion methods may be utilized to add the lead (Pb) or tin (Sn) or geranium (Ge) to the polycrystalline silicon film.

Next, the fabrication of a CMOS-TFT as the semiconductor device on the Sn-doped polycrystalline silicon film 2 on the glass substrate 1 shown in FIG. 1B is described while referring to FIGS. 3A through 3I.

Figure 3A:
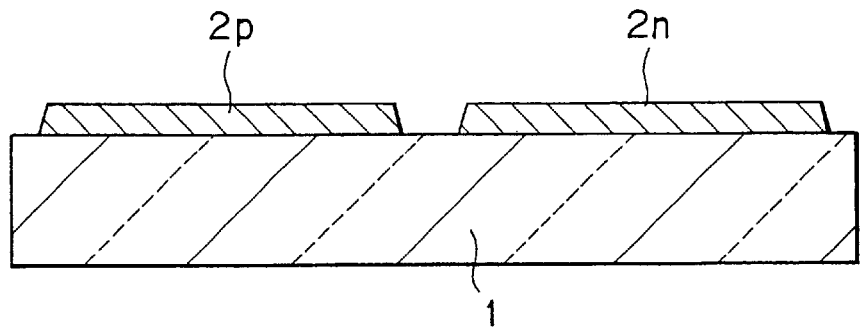
FIGS. 3A to 3C are essential cross sectional views for describing the process sequence for fabricating the CMOS-TFT in the polysilicon crystalline film obtained by the method of the present invention.

First, the resist is applied, and the etching mask formed by means of lithographic technology. This etching mask can then be used to etch the polycrystalline silicon film 2, for separation into a polycrystalline silicon film 2p forming a p-channel MOS transistor, and a polycrystalline silicon film 2n forming an n-channel MOS transistor as shown in FIG. 3A.

Figure 3B:
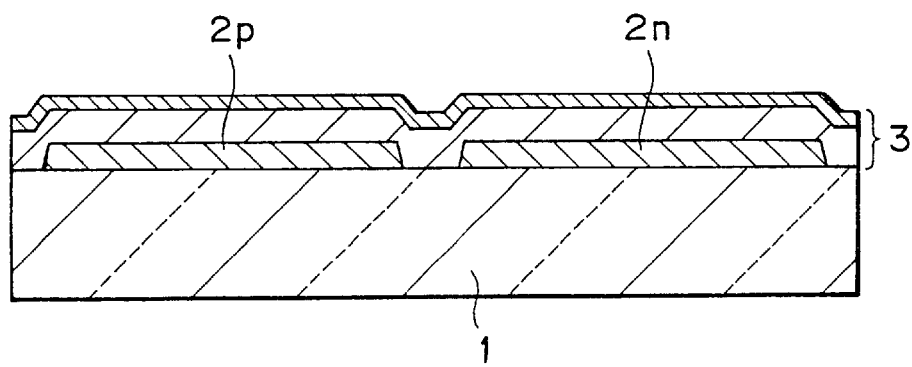

Next, a gate insulating film 3 is formed on the glass substrate 1 with the polycrystalline silicon films 2p and 2n in a covered state as shown in FIG. 3B. This gate insulating film 3 is deposited by plasma chemical vapor deposition, as an silicon oxide film in a thickness of approximately 200 nm, and then a further deposit of silicon nitride formed above in a thickness of approximately 50 nm. The film temperatures at this time are set for instance at 400° C.

Figure 3C:
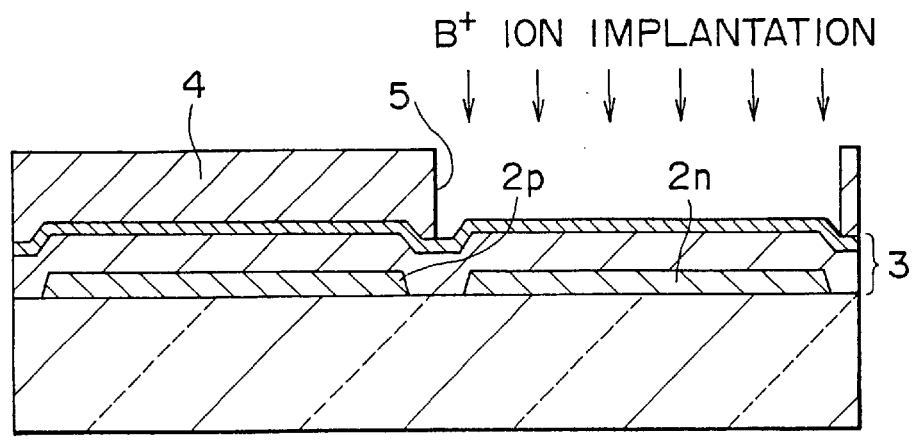

Next, a resist film 4 is formed on the gate insulating film 3 by a method such a rotating applicator as shown in FIG. 3C. Then, by means of lithographic technology, a resist mask is formed having an aperture 5 opening in the area forming the channel of the p channel MOS transistor. The polycrystalline silicon film 2n is covered by the resist film 4 even after the resist mask is formed. Afterwards, by utilizing the resist film 4 for the mask, channel ion implantation of the p channel MOS transistor is performed on the polycrystalline silicon film 2 by way of the gate insulating film 3. As ion implantation conditions for instance, phosphor ions ($P^+$) are utilized for the impurity, a dosing energy of 50 keV, and a dose of $1 \times 10$ atoms/cm$^2$ are set. The resist film 4 is removed afterwards. (The drawing shows the status prior to removal of the resist film 4.)

Figure 3D:
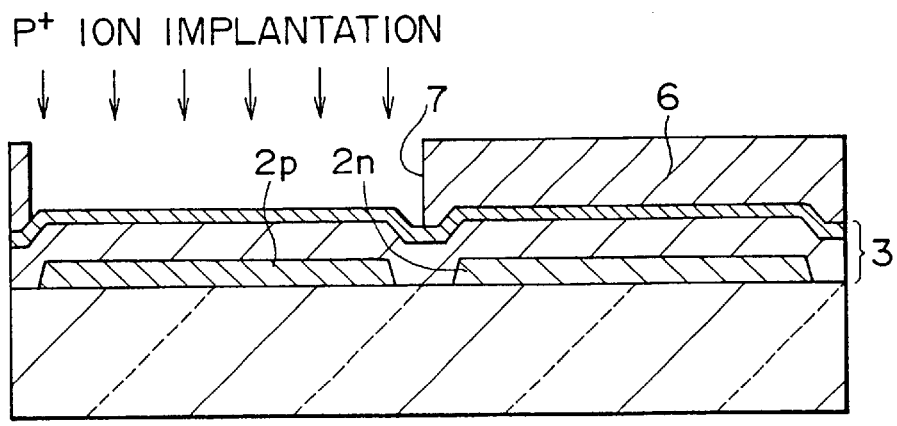
FIGS. 3D to 3F are essential cross sectional views for describing in sequence continuation of the process of FIG. 3C.

As next shown in FIG. 3D, a resist film 6 is formed such as by the rotating applicator method, on the gate insulating film 3. Then, by means of lithographic technology, a resist mask is formed having an aperture 7 opening in the area forming the channel of the n channel MOS transistor. The polycrystalline silicon film 2p is covered by the resist film 6 even after the resist mask is formed. Afterwards, by utilizing the resist film 6 as the mask, channel ion implantation of the n channel MOS transistor is performed on the polycrystalline silicon film 2n by way of the gate insulating film 3. As ion implantation conditions for instance, boron ions ($B^+$) are utilized for the impurity, a dosing energy of 30 keV, and a dose of $2.7 \times 10^{11}$ atoms/cm$^2$ are set. The resist film 4 is removed afterwards. (The drawing shows the status prior to removal of the resist film 4.)

Figure 3E:
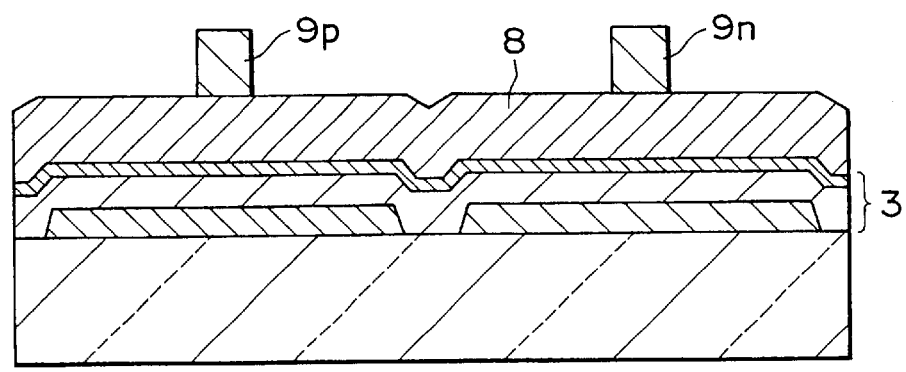

Next, a gate electrode film 8 is formed in a thickness of approximately 500 nm, for example of molybdenum (15%) and tantalum (85%) on the gate insulating film 3, for example by sputtering as shown in FIG. 3E.

Figure 3F:
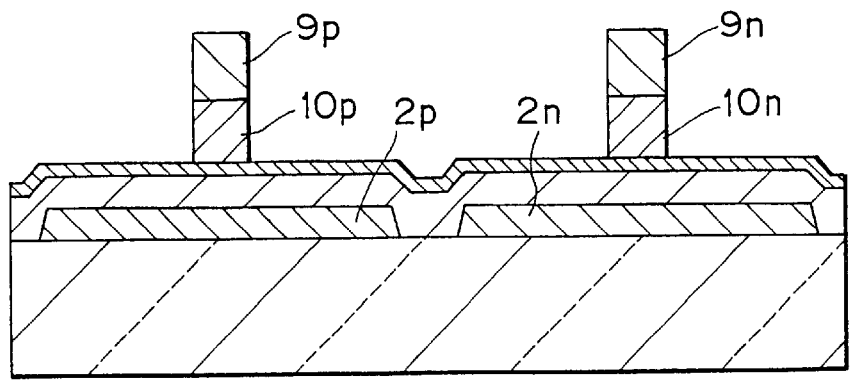

A resist film 9 is next formed on the gate electrode film 8 such as by the rotating applicator method. Then, a resist film 9 (9p, 9n) is left on the area formed by the gate electrode, by means of lithographic technology. Next, patterning of the gate electrode 8 is performed by dry etching technology utilizing the resist film 9 as a mask. As a result, the gate electrodes 10p and 10n are formed on each of the polycrystalline silicon films 2n and 2p by way of the gate insulating film 3 as shown in FIG. 3F. The resist films 9p, 9n are removed afterwards. (The drawing shows the status prior to removal of the resist films 9p, 9n.).

Figure 3G:
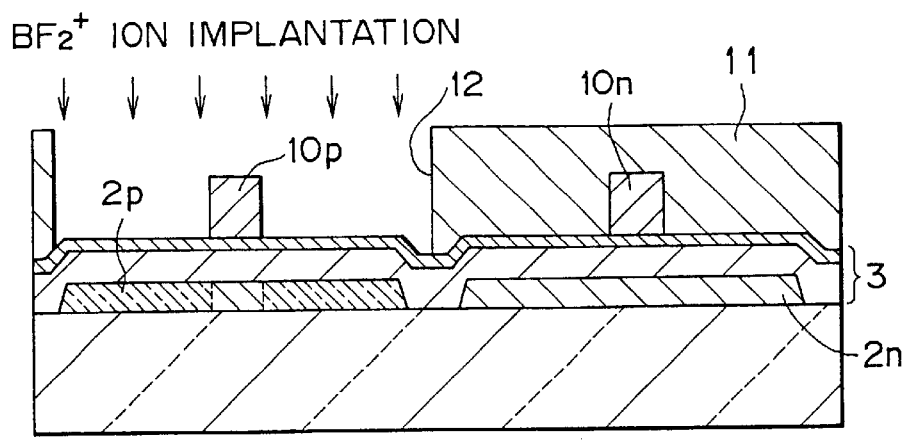
FIGS. 3G to 3I are essential cross sectional views for describing in sequence continuation of the process of FIG. 3F.

A resist film 11 is next formed as shown in FIG. 3G, by the rotating applicator method to cover the gate electrodes 10p, 10n. Then, by means of lithographic technology, a resist mask is formed having an aperture 12 opening in the area forming the channel of the n channel MOS transistor. The polycrystalline silicon film 2n is covered by this resist film 11 even after the resist mask is formed. Next, by utilizing the resist film 11 and the gate electrode 10 for the mask, source and drain ion implantation (or injection) of the p channel MOS transistor is performed on the polycrystalline silicon film 2p by way of the gate insulating film 3. As ion implantation conditions for instance, boron difluoride ions ($BF_2^+$) are utilized for the impurity, a dosing energy of 30 keV, and a dose of $2.7 \times 10^{15}$ atoms/cm$^2$ are set. The resist film 11 is removed afterwards. (The drawing shows the status prior to removal of the resist film 11.)

Figure 3H:
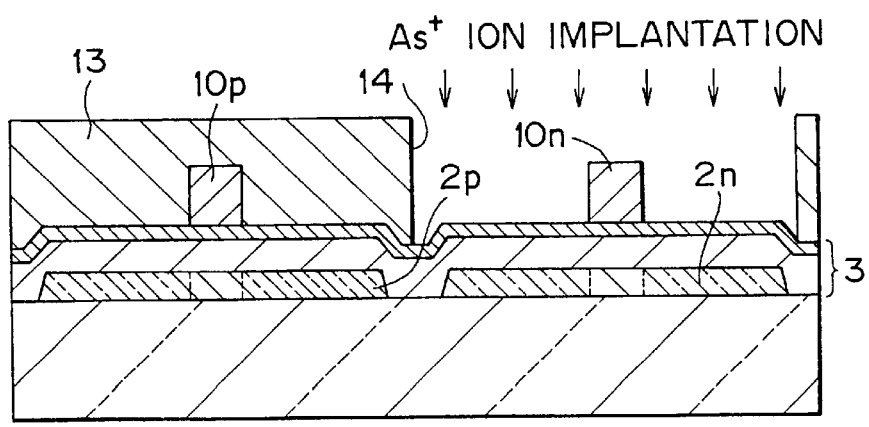

Next, a resist film 13 is formed to cover the gate electrodes 10p, 10n and the gate electrode film 3, by the rotating applicator method as shown in FIG. 3H. Then, by means of lithographic technology, a resist mask is formed with an aperture 14 opening in the area forming the channel of the n channel MOS transistor. The polycrystalline silicon film 2p is covered by this resist film 13 even after the resist mask is formed. Next, by utilizing the resist film 13 and the gate electrode 10n for the mask, source and drain ion implantation (or injection) of the n channel MOS transistor is performed on the polycrystalline silicon film 2n by way of the gate insulating film 3. As ion implantation conditions for instance, arsenic ions ($As^+$) are utilized for the impurity, a dosing energy of 70 keV, and a dose of $5 \times 10^{15}$ atoms/cm$^2$ are set. The resist film 13 is removed afterwards. (The drawing shows the status prior to removal of the resist film 13.)

Figure 3I:
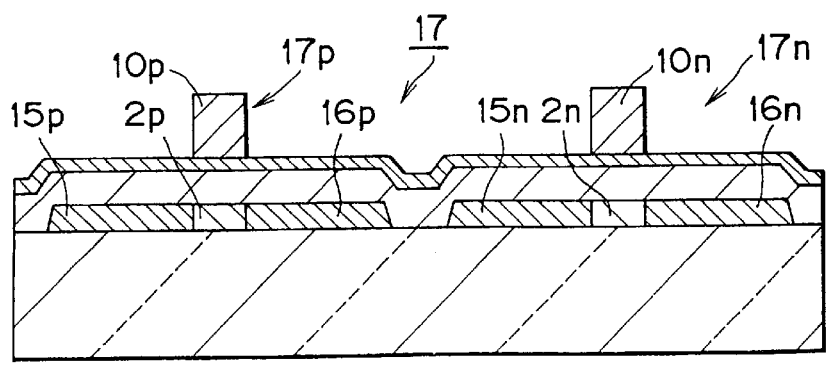

As next shown in FIG. 3I, activation annealing of the source and drain is performed by lamp heating for 10 seconds at a temperature for instance of 1000° C. a source region 15p formed on one side of the gate electrode 10p in the polycrystalline silicon film 2p, and by forming a drain region 16p in the polycrystalline silicon film 2p on the other side, a p channel MOS transistor 17p can be obtained. In the same way, a source electrode 15n is formed on one side of the gate electrode 10n in the polycrystalline silicon film 2n, and by forming a drain region 16n in the polycrystalline silicon film 2n on the other side, a p channel MOS transistor 17n can be obtained.

Here, the polycrystalline silicon film 2n between the drain region 16n and the source region 15n directly beneath the gate electrode 10n forms the channel region for the n channel MOS transistor 17n, and the polycrystalline silicon film 2p between the drain region 16p and the source region 15p directly beneath the gate electrode 10p forms the channel region for the n channel MOS transistor 17p. In this way, a CMOS transistor 17 can be obtained.

Afterwards, though not shown in the drawing, a silicon oxide film is formed to a thickness of approximately 200 nm by a method such as chemical vapor deposition (CVD) to cover the n channel MOS transistor 17n and the p channel MOS transistor 17p. A phosphor silicate glass (PSG) film is further deposited in a thickness of approximately 500 nm forming an interlayer insulating film. The PSG film here is formed for instance with a phosphor concentration of 3.5 wt % to 4.0 wt %.

A resist film is next deposited on the interlayer insulating film by the rotating applicator method, and by means of lithographic technology, a resist mask is further formed with an aperture on a region specified for forming the electrode. Etching of the interlayer insulating film is then performed using resist film as a mask, and contact holes formed. The resist mask is then removed, and an electrode film for example of aluminum silicon deposited by a method such as sputtering, in a thickness of approximately 1.0 µm on the interlayer insulating film including the internal section with the contact holes. The substrate temperature during sputtering was set at 150° C.

A resist film was next deposited on the electrode film by a method such as the rotating applicator, and resist pattern ing performed with lithographic technology to leave a resist film on a specified area for forming the electrode. The electrode film is then etched using the resist film as a mask, and the electrode and interconnection layers formed. The resist mask is then removed afterwards.

The CMOS transistor 17 formed in this way, utilizing the polycrystalline silicon film forming method of the present invention, can utilize glass with a low melting point as the substrate 1, since the impurity-doped polycrystalline silicon film 2 is formed in particularly by the catalytic chemical vapor deposition (CVD).

Also, by performing the specified processing on this impurity-doped polycrystalline silicon film 2, a CMOS transistor 17 can be fabricated as the semiconductor device by forming the n channel MOS transistor 17 and the p channel MOS transistor 17p so that the resulting semiconductor device of impurity-doped polycrystalline silicon film 2 will have a higher degree of electron and hole movement compared to ordinary polycrystalline silicon not containing impurities and the CMOS transistor 17 thus obtained will have high performance characteristics such as fast response speed.

The example described a CMOS transistor formed in the impurity-doped polycrystalline silicon film 2 obtained by the method of the present invention, however, semiconductor devices such as top gate TFT, bottom gate TFT, dual gate TFT, field discharge display device transistors, diodes, capacitors, resistors, photo-cells, (solar batteries), light-emitter devices, and light-receiver devices may also be formed instead of a CMOS transistor. In such cases also, the higher degree of hole and electron movement in the impurity-doped polycrystalline silicon film 2 will yield a semiconductor device with high performance characteristics.

Thus, the above described method of the present invention for forming a polycrystalline silicon film, is a method for forming an impurity-doped polycrystalline silicon film added with impurities of at least one type from among tin (Sn), germanium (Ge) and lead (Pb) in group N of the periodic table of the elements, so that the polysilicon crystalline film obtained by adding this tin (Sn), germanium (Ge) and lead (Pb) has a high degree of electron and hole movement, and an effect of the invention is that fabricating semiconductor devices with this polycrystalline silicon film, allows the manufacture of high quality semiconductor devices such as high efficiency solar cells and thin film transistors of high current density.

Another effect of the invention is that by further applying an annealing process to the polycrystalline silicon film obtained by the above method, an even higher degree of electron and hole movement can be achieved.

Yet another effect is that using the catalytic chemical vapor deposition method for forming a polycrystalline silicon film allows heating the substrate at a low temperature (100° C., to 600° C.) so that an inexpensive, large-size, low skewness glass can easily be utilized as the substrate.

Still another effect is that since an inexpensive item can be utilized as the substrate, the manufacturing costs of the polycrystalline silicon film itself will be inexpensive.

What is claimed is:

1. A polycrystalline silicon film forming method which comprises:

forming said polycrystalline silicon film by a catalytic chemical vapor deposition method, said polycrystalline silicon film being doped with impurities at a concentration ranging from $10^{18}$ atoms/cm$^3$ to $10^{20}$ atoms/cm$^3$, the impurities being selected from at least one type among tin (Sn), germanium (Ge) and lead (Pb).

2. A polycrystalline silicon film forming method according to claim 1, wherein when performing the chemical vapor deposition method to form said polycrystalline silicon film, any one of organic compounds, hydrogen compounds or sodium of tin (Sn), or germanium (Ge) or lead (Pb) is utilized as the base material of a chemical compound comprising at least one type from among tin (Sn), germanium (Ge) and lead (Pb).

3. A polycrystalline silicon film forming method, which comprises:

forming said polycrystalline silicon film by a catalytic chemical vapor deposition method; and after forming of said polycrystalline silicon film, doping said polysilicon film with impurities at a concentration ranging from $10^{18}$ atoms/cm$^3$ to $10^{20}$ atoms/cm$^3$, the impurities comprising at least one type from among tin (Sn) germanium (Ge) or lead (Pb).

4. A polycrystalline silicon film forming method according to claim 3, wherein tin (Sn), or germanium (Ge) or lead (Pb) are added to the polycrystalline silicon film by ion implantation, ion doping or diffusion methods.

5. A polycrystalline silicon film forming method according to claim 1, wherein said polycrystalline film is formed on a glass substrate.

6. A polycrystalline silicon film forming method according to claim 3, wherein said polycrystalline film is formed on a glass substrate.

7. A polycrystalline silicon film forming method according to claim 1, wherein said polycrystalline film is doped by a step comprising introducing said Sn, Ge, or Pb impurities into a reaction chamber as hydride compounds, together with at least silicon hydride and hydrogen gas.

8. A polycrystalline silicon film forming method according to claim 3, wherein said doping step comprises introducing said Sn, Ge, or Pb impurities into a reaction chamber as hydride compounds, together with at least silicon hydride and hydrogen gas.

9. A polycrystalline silicon film forming method according to claim 1, wherein said polycrystalline silicon film is formed prior to being doped with said impurities.

10. A polycrystalline film forming method according to claim 1, wherein said impurities are present in said polycrystalline film at a time of deposition of said polycrystalline film, said deposition being performed at a forming speed of 50 nm/minute.

11. A polycrystalline film forming method according to claim 1, wherein said polycrystalline film is formed at a temperature between 1600° C. and 1800° C.

* * * * *